United States Patent
Liu (10) Patent No.: US 9,181,089 B2
(45) Date of Patent: Nov. 10, 2015

(54) CARBON NANOTUBE CROSSBAR BASED NANO-ARCHITECTURE

(75) Inventor: Bao Liu, San Antonio, TX (US)

(73) Assignee: Board of Regents of the University of Texas System, Austin, TX (US)

( * ) Notice: Subject to any disclaimer, the term of this patent is extended or adjusted under 35 U.S.C. 154(b) by 215 days.

(21) Appl. No.: 13/522,467

(22) PCT Filed: Jan. 14, 2011

(86) PCT No.: PCT/US2011/021329
§ 371 (c)(1),
(2), (4) Date: Oct. 10, 2012

(87) PCT Pub. No.: WO2011/088340
PCT Pub. Date: Jul. 21, 2011

(65) Prior Publication Data
US 2013/0033310 A1  Feb. 7, 2013

Related U.S. Application Data

(60) Provisional application No. 61/295,593, filed on Jan. 15, 2010.

(51) Int. Cl.
| H01L 21/70 | (2006.01) |
| B82Y 10/00 | (2011.01) |
| H01L 27/112 | (2006.01) |
| H01L 51/00 | (2006.01) |
| H01L 27/28 | (2006.01) |
| H01L 51/05 | (2006.01) |
| H01L 51/10 | (2006.01) |

(52) U.S. Cl.
CPC ............... *B82Y 10/00* (2013.01); *H01L 27/112* (2013.01); *H01L 27/283* (2013.01); *H01L 27/285* (2013.01); *H01L 51/0048* (2013.01); *H01L 51/0049* (2013.01); *H01L 51/0554* (2013.01); *H01L 51/0558* (2013.01); *H01L 51/102* (2013.01); *G11C 2213/14* (2013.01)

(58) Field of Classification Search
USPC .......................................................... 257/390
See application file for complete search history.

(56) References Cited

U.S. PATENT DOCUMENTS

| 6,128,214 A * | 10/2000 | Kuekes et al. ................ 365/151 |
| 6,256,767 B1 * | 7/2001 | Kuekes et al. ................ 365/151 |
| 6,314,019 B1 | 11/2001 | Kuekes et al. |
| 6,549,035 B1 | 4/2003 | Asayeh |

(Continued)

OTHER PUBLICATIONS

O'Connor et al., CNTFET Modeling and Reconfigurable Logic-Circuit Design, 2007, IEEE Transactions on Circuits and Systems—I, vol. 54, 2365-2379.*

(Continued)

*Primary Examiner* — Dale E Page
(74) *Attorney, Agent, or Firm* — Meyertons, Hood, Kivlin, Kowert & Goetzel, P.C.; Eric B. Meyertons (57) ABSTRACT

Carbon nanotubes (CNTs) and carbon nanotube field effect transistors (CNFETs) have demonstrated extraordinary properties and are widely accepted as the building blocks of next generation VLSI circuits. A CNT crossbar based nano-architecture, includes layers of orthogonal carbon nanotubes with electrically bistable and charge holding molecules at each crossing, forming a dense array of reconfigurable double gate carbon nanotube field effect transistors (RDG-CNFETs) and programmable interconnects, which is addressed via a voltage controlled nanotube addressing circuits on the boundaries.

5 Claims, 5 Drawing Sheets

(56) References Cited

U.S. PATENT DOCUMENTS

| | | | |
|---|---|---|---|
| 6,559,468 | B1 * | 5/2003 | Kuekes et al. ............... 257/14 |
| 6,760,245 | B2 * | 7/2004 | Eaton et al. ............... 365/100 |
| 6,781,166 | B2 | 8/2004 | Lieber et al. |
| 6,900,479 | B2 | 5/2005 | DeHon et al. |
| 6,944,054 | B2 | 9/2005 | Rueckes et al. |
| 6,963,077 | B2 | 11/2005 | Dehon et al. |
| 7,073,157 | B2 | 7/2006 | Dehon et al. |
| 7,172,953 | B2 | 2/2007 | Lieber et al. |
| 7,242,601 | B2 | 7/2007 | Dehon et al. |
| 2003/0098488 | A1 * | 5/2003 | O'Keeffe et al. ............. 257/401 |
| 2004/0149978 | A1 * | 8/2004 | Snider ............... 257/3 |
| 2006/0141222 | A1 * | 6/2006 | Fischer et al. ............... 428/172 |
| 2007/0102747 | A1 | 5/2007 | Chen et al. |
| 2007/0291524 | A1 | 12/2007 | Davis et al. |
| 2009/0167710 | A1 | 7/2009 | Jiang et al. |
| 2009/0173935 | A1 | 7/2009 | Cho et al. |

OTHER PUBLICATIONS

Lee et al., Fabrication of Crossed Junctions of Semiconducting and Metallic Carbon Nanotubes: A CNT-Gated CNT-FET, 2006, Journal of Nanoscience and Nanotechnology, vol. 6, 1325-1330.*

Search Report for PCT Application No. PCT/US2011/021329 issued Oct. 12, 2011.

Written Opinion for PCT Application No. PCT/US2011/021329 issued Oct. 12, 2011.

International Preliminary Report on Patentability for PCT Application No. PCT/US2011/021329 issued Jul. 17, 2012.

Duan et al. "Nonvolatile Memory and Programmable Logic from Molecule-Gated Nanowires" Nano Letters, 2002, vol. 2, No. 5, 487-490.

Nguyen et al. "Direct Integration of Metal Oxide Nanowire in Vertical Field-Effect Transistor" Nano Letters, 2004, vol. 4, No. 4, 651-657.

Pease et al. "Switching Devices Based on Interlocked Molecules" Acc. Chem. Res., 2001, 34 (6), pp. 433-444, (Abstract).

RayChowdhury "Carbon Nanotube Electronics: Design of High-Performance and Low-Power Digital Circuits" IEEE Trans. on Circuits and Systems—I: Fundamental Theory and Applications, 54(11), pp. 2391-1401, 2007, (Abstract).

Schmidt et al. "Nanoscale silicon structures by using carbon nanotubes as reactive ion etch masks" 2005 Nanotechnology 16, 750-753, (Abstract).

* cited by examiner

CARBON NANOTUBE CROSSBAR BASED NANO-ARCHITECTURE

PRIORITY CLAIM

This application is a 371 of PCT Application No. PCT/US2011/021329, filed Jan. 14, 2011, which claims priority to U.S. Provisional Application Ser. No. 61/295,593, filed Jan. 15, 2010.

BACKGROUND OF THE INVENTION

1. Field of the Invention

The invention generally relates to nanoelectronic devices. More particularly, the invention relates to nanoelectronic devices that include carbon nanotubes.

2. Description of the Relevant Art

Silicon based CMOS technology scaling has driven the semiconductor industry towards cost minimization and performance improvement in the past four decades, and is rapidly approaching its end. On the other hand, nanotechnology has achieved significant progress in recent years, fabricating a variety of nanometer scale devices, e.g., molecular diodes and carbon nanotube field effect transistors. This has provided new opportunities for VLSI circuits to achieve continuing cost minimization and performance improvement in a post-silicon-based-CMOS-technology era.

However, significant challenges need to be overcome before reliable high performance nanoelectronic circuits can be achieved. Challenges that need to be overcome include:

1. Manufacturability. As minimum layout feature size is becoming smaller than lithography light wavelength, traditional lithography based manufacturing process can no longer achieve the needed resolution, leading to significant process variation. Resolution enhancement and other design for manufacturability techniques become less applicable as scaling continues. Alternatively, nanoelectronic circuits are expected to be based on bottom-up self-assembly based manufacturing processes, e.g., molecular beam epitaxy (MBE). Such bottom-up self-assembly manufacturing processes provide regular structures, e.g., perfectly aligned carbon nanotubes. Consequently, nanoelectronic circuits need to rely on reconfigurability to achieve functionality and reliability.

2. Reliability. Technology scaling has led to increasingly significant process and system runtime variations, including critical dimension variation, dopant fluctuation, electromagnetic emission, alpha particle radiation and cosmos ray strikes. Such variations cannot be avoided by manufacturing process improvement, and is inherent at nanometer scale, as is dictated by the stochastic nature of quantum physics. A variety of robust design techniques, including redundant, adaptive, and resilient design techniques at multiple (architecture, circuit, layout) levels, are needed to achieve a reliable nanoelectronic circuit.

3. Performance. Nanoscale devices have achieved high performance in the absence of significant load, however, system performance bottleneck lies in global interconnects. Rent's rule predicts that the maximum global interconnect wirelength scales with the gate number in a circuit in a power law. Interconnect design would be critical to performance improvement of large scale nanoelectronic circuits.

Existing nanoelectronic architectures are in three categories: (1) resonant tunneling diodes and negative differential resistors based on early nanoelectronic architecture, (2) mainstream hybrid nano-CMOS technology based nanoelectronic architecture, and (3) fax future DNA-guided self-assembly based nanoelectronic architecture.

Carbon nanotubes and carbon nanotube field effect transistors are expected to be the building blocks of nanoelectronic circuits due to their extraordinary properties. Carbon nanotube crossbar structure is one of the most prominent candidates for nanoelectronic design platform. Recently, UIUC researchers have achieved fabrication of dense perfectly aligned carbon nanotube arrays. Such a carbon nanotube crossbar structure forms the basis of nanoscale memories, and provides a reconfigurable computing platform of manufacturability and reliability for next generation VLSI designs.

However, no nanoelectronic architecture has been proposed which is solely based on carbon nanotubes and carbon nanotube field effect transistors. The reasons include lack of a self-assembly process which could form complex carbon nanotube structures, or, absence of a reconfigurable carbon nanotube device which could provide functionality and reliability.

Another outstanding challenge for realizing such nanoelectronic systems is how to precisely address an individual nanoscale wire (e.g., carbon nanotube) in an array. Designing a nano-addressing circuit is a challenging task, because (1) the nanoscale layout cannot be manufactured precisely unless it is of a regular structure, and (2) the nano-addressing circuit cannot be based on reconfigurability since it provides reconfigurability to the rest of the nanoelectronic system. Existing nano-addressing circuits require precise layout control such as lithography, doping, or etching, which is highly unlike to achieve alignment at the nanometer scale due to the presence of prevalent defects and significant process variations. These techniques also exhibit certain levels of randomness, which brings nanoscale wires that cannot be differentiated or addressed, and requires testing schemes which associate nanoscale wires with addresses.

Among various nanotechnology devices, carbon nanotube field effect transistors are the most promising candidates to replace the current CMOS field effect transistors as the building blocks of nanoelectronic circuits. Carbon nanotubes are one of the most promising candidates for interconnect technology at nanometer scale, due to their extraordinary properties in electrical and thermal conductivity, and mechanical strength. A carbon nanotube ("CNT") is a one-atom-thick graphene sheet rolled up in a cylinder having a nanometer order diameter, which is semiconductive or metallic depending on its chirality. The cylinder form eliminates boundaries and boundary-induced scattering, yielding electron mean free path on the order of micrometers compared with few tens of nanometers in copper interconnects. This gives extraordinary current carrying capacity, achieving a current density on the order of $10^9$ A/cm$^2$. However, large resistance exists at CNT-metal contacts, reducing the performance advantage of CNTs over copper interconnects.

Three kinds of carbon nanotube based field effect transistors (CNFETs) have been manufactured:

(1) A Schottky barrier based carbon nanotube field effect transistor (SB-CNFET) consists of a metal-nanotube-metal junction, and works on the principle of direct tunneling through the Schottky barrier formed by direct contact of metal and semiconducting nanotube. The barrier width is modulated by the gate voltage. This device has the most mature manufacturing technique up to today, while two problems limit its future: (a) The metal-nanotube contact severely limits current. (b) The ambipolar conduction means this device cannot be applied to conventional circuit design methods.

(2) A MOSFET-like CNFET is made by doping a continuous nanotube on both sides of the gate, thus forming the source/drain regions. This is a unipolar device of high on-current.

(3) A band-to-band tunneling carbon nanotube field effect transistor (T-CNFET) is made by doping the source and the drain regions into p+ and n+ respectively. This device has low on-current and ultra low off current, making it potential for ultra low power applications.

Molecular electronic devices are based on two families of molecules: the catenanes which consist of two or more interlocked rings, and the rotaxanes which consist of one or more rings encircling a dumbbell-shaped component. These molecules can be switched between states of different conductivities in a redox (reduction/oxidation) process by applying currents through them, providing reconfigurability for nanoscale devices.

A variety of reconfigurable nanoscale devices have been proposed. Resonant tunneling diodes based on redox active molecules are configurable on/off. Nanowire field effect transistors with redox active molecules at gates are of high/low conductance. Spin-RAM devices are of high/low conductivity based on the parallel/anti-parallel magnetization configuration of the device which is configured by the polarity of the source voltage. A double gate Schottky barrier CNFET is configurable to be a p-type FET, an n-type FET, or off, by the electrical potential of the back gate. A double gate field effect transistor with the back gate driven by a three state RTD memory cell is configurable to be a transistor or an interconnect, reducing reconfiguration cost of a gate array.

At least three categories of nanoelectronic architectures have been proposed. An early nanoelectronic architecture, NanoFabrics, was based on molecular resonant tunneling diodes (RTDs) and negative differential resistors (NDRs). It was observed that passive device (diode/resistor) based circuits lack signal gain to recover from signal attenuation, while combining with CMOS circuits compromises scaling advantages. Latches based on negative differential resistors (NDRs) were proposed, which, unfortunately, have become obsolete since the publication.

The majority of the existing nanoelectronic architectures are based on a hybrid nano-CMOS technology, with CMOS circuits complementing nanoelectronic circuits. In FPNI (CMOL), a nanowire crossbar is placed on top of CMOS logic gates (inverters). The nanowires provide programmable interconnects (and wired-OR logic), while the CMOS gates(inverters) provide logic implementation (signal inversion and gain). Such architectures achieve compromised scaling advantage in term of device density. It has been proposed to combine programmable nanoscale diode logic arrays with fixed simple CMOS circuitry, e.g., of precharge and evaluation transistors as in domino logic for signal gain. Sequential elements need also to be implemented as CMOS circuits. However, the optimal size of a combinational logic block is typically small (e.g., of 30-50 gates), which results in significant CMOS circuitry overhead in such architectures. An exception is memory design, where CMOS technology provides peripheral circuitry such as address decoders and read sensors with moderate overhead, while nanotechnology provides scaling advantage in memory cells.

The third category of existing nanoelectronic architectures relies on DNA-guided self-assembly to form 2-D scuffles for nanotubes or 3-D DNA-rods. Such technologies target application in the far future.

A nano-addressing circuit consists of a crossbar of orthogonal microscale wires and nanoscale wires. Electrical signals (address signals) coming from the microscale wires (address lines) supposedly select one of the nanoscale wires (data lines) to be conductive (for data in/out). Existing nano-addressing circuits are realized as binary decoders, i.e., every nanoscale wire is selected by a (supposedly unique) binary address. This requires that each nanoscale wire needs to have a unique gate configuration. However, such precise layout design is unlikely to achieve at a sublithographic nanometer scale (without significantly compromised yield), because nanoscale structures are expected to be bottom-up self-assembled regular structures, instead of defined by a top-down process like lithography.

Existing nano-addressing mechanisms are in four categories as follow.

1. Randomized contact decoder includes gold particles which are deposited at random as contacts between nanoscale and microscale wires. Testing and feedback provide a one-to-one mapping between a nanoscale wire and an address.
2. Undifferentiated nanoscale wires are addressable by microscale wires with (e.g., lithography defined) different gate configurations (which requires nanoscale wire spacing in the same order of lithography resolution).
3. Alternatively, different gate configurations are realized in the nanoscale wires, by growing lightly-doped and heavily-doped carbon nanotubes of different length alternatively, while the microscale wires are undifferentiated. A microscale wire crossing a lightly-doped nanotube segment forms a gate, while a heavily-doped nanotube segment is always conductive for all possible signals in the microscale wire. In such a case, precise control of the lengths of the lightly- and heavily-doped nanotube segments would be critical.
4. In radial addressing, multi-walled carbon nanotubes are grown with lightly- and heavily-doped shells, an etching process removes the heavily-doped outer shells at precise locations, and defines the gate configurations at each crossing of nanoscale and microscale wires.

Process variations are inevitably significant at nanometer scale due to the stochasticness of quantum physics and thermodynamics. As a result, these existing nano-addressing structures have limited yield, e.g., there is certain probability that two nanoscale wires have identical or similar gate configuration due to process variation. Furthermore, nanoscale wires are mostly partially selected, e.g., they may not achieve the ideal conductivity upon selected, due to process variations such as misalignment, dopant variation, etc.

SUMMARY OF THE INVENTION

In one embodiment, a double gate carbon nanotube field effect transistor (RDG-CNFET), which is reconfigurable to be open, short, FET, or via, includes a first carbon nanotube (CNT) as the front gate, which is either metallic or doped to p- or n-type; a second CNT as the source, the drain, and the channel, which is orthogonal to the first CNT, and doped to p-n-p, p-i-p, n-p-n, or n-i-n type, where i stands for intrinsic (un-doped), the source and the drain are doped to n- or p-type opposite to that of the channel (if the channel is doped); a third CNT as the back gate, which has the same orientation as the first CNT, and is either metallic or doped to p- or n-type; an electrically bistable molecules which are coated around the front gate and sandwiched between the front gate and the source/drain regions, and dielectric and redox active molecules coated around the back gate and sandwiched between the back gate and the source/drain regions.

In an embodiment, a voltage controlled nanoscale wire addressing circuit includes two address lines which are orthogonal to the data lines, wherein each address-line-data-line crossing comprises a field effect transistor, with the address line forming the gate of the transistor, the data line forming the channel of the transistor. Each address line forms a voltage scale under an external voltage; and the external voltages applied to the two address lines are of opposite polarity.

A carbon nanotube and carbon nanotube transistor based nanoelectronic architecture, includes layers of orthogonal carbon nanotubes with electrically bistable and charge holding molecules at each crossing, the layers forming a dense array of RDG-CNFET devices and programmable interconnects, and voltage controlled nanotube addressing circuits on the four boundaries.

BRIEF DESCRIPTION OF THE DRAWINGS

Advantages of the present invention will become apparent to those skilled in the art with the benefit of the following detailed description of embodiments and upon reference to the accompanying drawings in which.

While the invention may be susceptible to various modifications and alternative forms, specific embodiments thereof are shown by way of example in the drawings and will herein be described in detail. The drawings may not be to scale. It should be understood, however, that the drawings and detailed description thereto are not intended to limit the invention to the particular form disclosed, but to the contrary, the intention is to cover all modifications, equivalents, and alternatives falling within the spirit and scope of the present invention as defined by the appended claims.

DETAILED DESCRIPTION OF THE PREFERRED EMBODIMENTS

It is to be understood the present invention is not limited to particular devices or systems, which may, of course, vary. It is also to be understood that the terminology used herein is for the purpose of describing particular embodiments only, and is not intended to be limiting. As used in this specification and the appended claims, the singular forms "a", "an", and "the" include singular and plural referents unless the content clearly dictates otherwise.

Reconfigurable Double Gate-Carbon Nanotube Field Effect Transistor

Figure 1:
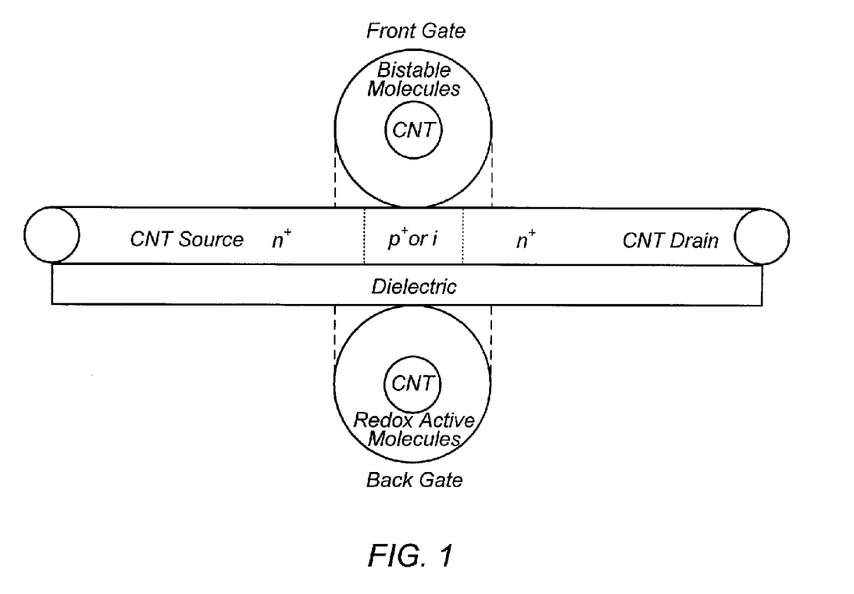
FIG. 1 depicts a schematic diagram of an n-type MOSFET-like reconfigurable double gate carbon nanotube field effect transistor (RDG-CNFET)

FIG. 1 is an illustration of the proposed reconfigurable double gate CNFET device, which is constructed by sandwiching electrically bistable molecules in a double gate CNFET. The double gate CNFET is constructed by three overlapping orthogonal carbon nanotubes. The top and the bottom carbon nanotubes form the front gate and the back gate, while doping the carbon nanotube in the middle layer forms the source and the drain of a n- or p-type MOSFET-like CNFET. Electrically bistable molecules are coated around the front gate and sandwiched between the front gate and the source/drain regions. Dielectric and redox active molecules are coated around the back gate and sandwiched between the back gate and the source/drain regions.

The redox active molecules at the back gate are electrically reconfigurable to hold/release charge in a redox process, which controls the CNFET threshold voltage and conductance, or, turns the CNFET on or off. For example, when a ±10V voltage is applied to cobalt phthalocyanine (CoPc) molecules, a redox process is triggered, which results in a NW-FET conductance change of nearly $10^4$ times. Such reconfiguration of CoPc molecules is repeatable for more than 100 times.

The bistable molecules sandwiched between the front gate and the source/drain regions are electrically reconfigurable to be conductive or insular, making the device a via or a FET. An example of such electrically bistable molecules is reported in Pease et al. "Switching Devices Based on Interlocked Molecules," Acc. Chem. Res., 34, pp. 433-444, 2001, which reports that oxidative degradation reduces resonant tunneling current of the V-shaped amphiphilic [2]-rotaxane $5^{4+}$ molecules by nearly a factor of 100. Alternatively, the anti-fuse technologies in the existing reconfigurable architectures provide one-time configurability. For example, the QuickLogic ViaLink technology include a layer of amorphous silicon sandwiched between two layers of metal. A 10V programming voltage provides a resistance difference between GW and 80 W.

Figure 2:
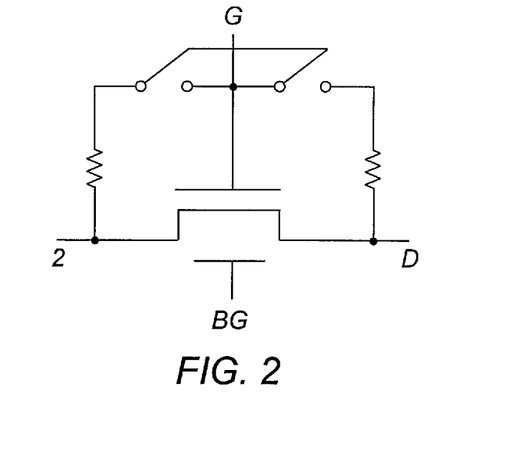
FIG. 2 depicts a schematic diagram of a compact model of an n-type MOSFET-like reconfigurable double gate carbon nanotube field effect transistor (RDG-CNFET)

FIG. 2 gives the compact model for this RDG-CNFET device, including a double gate transistor and two resistors which are switched on/off simultaneously between the source/drain and the gate of the double gate transistor. This RDG-CNFET is reconfigurable to the following components.

1. Via, when the front gate bistable molecules are configured to be conductive. The overlapping of the front gate and the source/drain regions forms conductive contacts. As a result, the front gate, the source, and the drain is short circuited. The device is configured as a via between the carbon nanotube at the top and in the middle layer.

2. Short, when the front gate bistable molecules are configured to be insular, and the back gate redox active molecules are configured to hold positive(negative) charge in a n-type(p-type) CNFET. The CNFET is on for any front gate voltage.

3. MOSFET-like CNFET, when the front gate bistable molecules are configured to be insular, and the back gate redox active molecules are configured to hold negative (positive) charge in a n-type(p-type)MOSFET-like CNFET. The CNFET threshold voltage is adjustable by the doping concentration in the channel (p or n doping for a n- or p-type CNFET), such that when the back gate redox active molecules are configured to hold negative (positive) charge in a n-type(p-type) MOSFET-like CNFET, the CNFET achieves both performance and leakage control.

4. Open, when the MOSFET-like CNFET is turned off.

This is achieved at the architecture level as follows.

A CNT Crossbar Based Nano-Architecture

Figure 3:
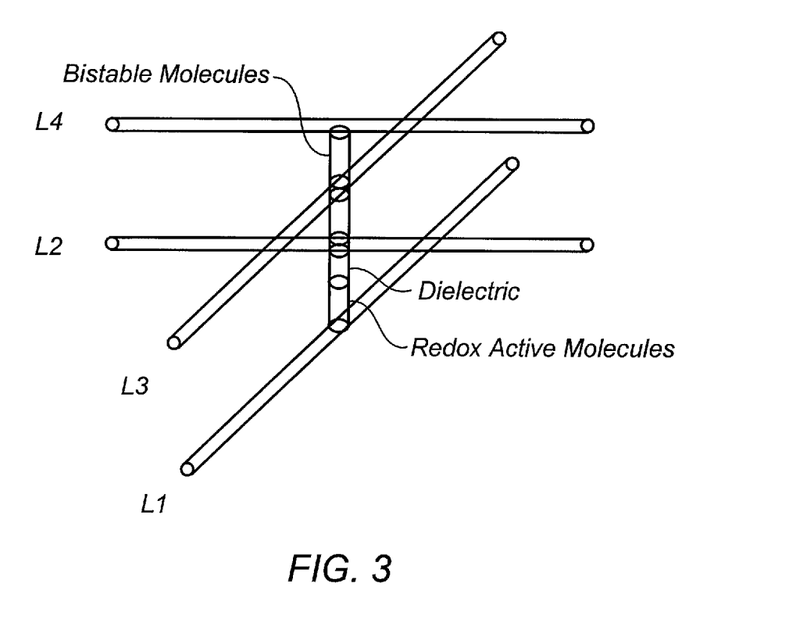
FIG. 3 depicts a schematic diagram of carbon nanotube (CNT) layers in a nanoelectronic architecture.

FIG. 3 is an illustration of a purely carbon nanotube and carbon nanotube transistor based nanoelectronic architecture, which is constructed by growing layers of orthogonal carbon nanotubes, with dielectric and redox active molecules or bistable molecules sandwiched at each crossing. Such molecules can be first coated around a carbon nanotube then undergo an etching process with the top layer of carbon nanotubes as masks. (See, for example, Duan et al. "Nonvolatile Memory and Programmable Logic from Molecule-Gated Nanowires," Nano Letters, 2(5), pp. 487-490, 2002 and Schmidt et al. "Nano-Scale Silicon structures by Using Carbon Nanotubes as Reactive Ion Masks," Nanotechnology, 16, pp. 750-753, 2005, both of which are incorporated herein by reference) The remaining molecules are located at each crossing. The first layer (L1) of carbon nanotubes constitutes the back gates of the RDG-CNFETs. The second layer (L2) of carbon nanotubes constitutes the source/drain regions of the CNFETs. The third layer (L3) of carbon nanotubes constitutes the front gates of the CNFETs. The fourth (L4) and upper (L5-) layers of carbon nanotubes form the interconnects. Dielectric and redox active (e.g., CoPc) molecules are sandwiched between L1 and L2 layers of carbon nanotubes. Electrically bistable (conductive or insular, e.g., amorphous silicon) molecules are sandwiched between adjacent layers of carbon nanotubes above L2. P-type and n-type of MOSFET-like CNFETs are formed by doping the L2 carbon nanotubes selectively, e.g., in a mask based process. The masks define the p-wells and the n-wells, e.g., based on a lithography process. As such, n-well and p-well dimensions in the order of, e.g., 22 nm, can be made leading to about 10 rows of CNFETs in each n- or p-well. Certain front gate carbon nanotubes are dedicated to cutting off the CNFET chains (configuring to opens) and form CNFET clusters for each circuit component. This is similar to the gate isolation technology in sea-of-gates designs.

Carbon nanotubes on the third (L3) and upper layers form interconnects. Doping based carbon nanotubes may be used as conductors for reconfigurability of opens at interconnects, while metallic carbon nanotubes, upon identification, may be utilized for global interconnects if not avoided or removed. Two types of crossings may be constructed between any two adjacent layers of carbon nanotubes on the third (L3) and upper layers: (1) electrically bistable molecules which could form vias or inter layer dielectric, as between L2 and L3, and (2) dielectric and redox active molecules which gate a CNFET, as between L1 and L2. These two types of crossings can be formed in a mask based deposition process, similar to those in the current technologies. At each type (2) crossing, a CNFET is formed by doping, which forms the source/drain regions, while leaving the area under the crossover as the channel. At each type (1) crossing, a CNFET is avoided, e.g., by doping to the area under the crossover by deflection of ions. As a result, a reconfigurable interconnect structure is achieved with programmable vias and opens. A multi-layer routing structure may be constructed, similar to those in current technologies.

Figure 4:
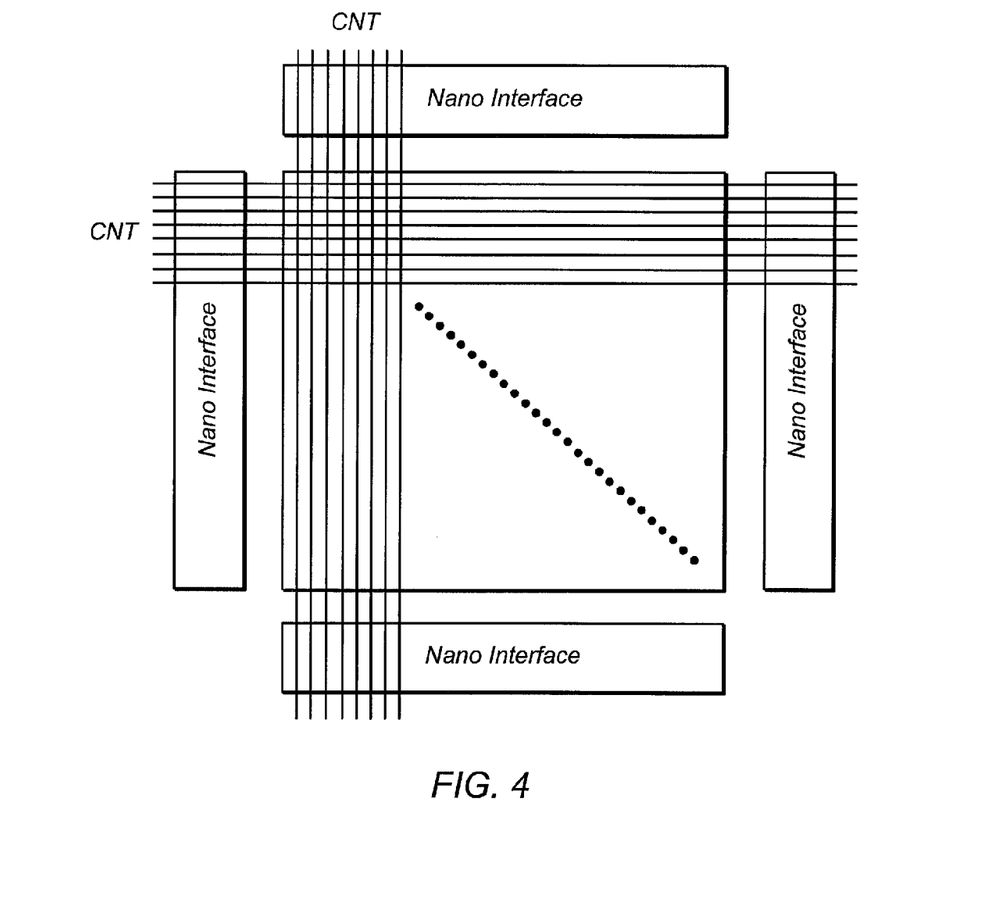
FIG. 4 depicts a schematic diagram of layers of orthogonal carbon nanotubes forming a dense array of RDG-CNFETs and programmable interconnects addressed by voltage controlled nanotube addressing interface.

FIG. 4 gives the top view of the proposed nanoelectronic architecture, including arrays of orthogonal carbon nanotubes, which are addressed by nano-interfaces (voltage controlled nanotube addressing circuits) on the four boundaries (in reconfiguration, the opens are formed starting from the middle of a carbon nanotube, such that any remaining segment of the nanotube is still accessible from a nanotube addressing interface).

The proposed CNT crossbar nano-architecture can be extended to implement 3-D VLSI circuits. 3-D VLSI circuits are under active research in recent years due to their potential of achieving reduced wirelength, reduced power consumption and improved performance. However, silicon based VLSI circuits are essentially 2-D, because MOSFETs are surface devices on the bulk of silicon, thus 3-D MOSFET circuits can only be achieved by bonding chips. It is important for silicon based 3-D MOSFET circuits to achieve (1) bonding technology which provides acceptable mechanical strength, (2) via technology which provides low resistive interconnects between chips, and (3) heat dissipation in a multiple chip system for silicon based 3-D circuits. In contrast, CNFET and CNFET based nano-architectures provide excellent platforms for 3-D VLSI circuits, because (1) CNTs and CNFETs are not confined to certain surface and can be manufactured in 3-D space, (2) CNTs possess excellent current carrying, mechanical and heat dissipation properties which are critical to 3-D VLSI circuits.

In a 3-D VLSI implementation, the RDG-CNFETs do not need to be confined on the bottom layers, with the upper layers dedicated to interconnects. Instead, transistors and interconnects are free to be located on each layer of carbon nanotubes. Gate forming (dielectric and redox active) molecules and via-forming (electrically bistable) molecules are distributed between adjacent CNT layers. Combination of the types of molecules surrounding a CNT segment gives three components.

1. Gate-forming molecules both on top and on bottom of a CNT segment give a device which is reconfigurable to either open or short.
2. Gate-forming and via-forming molecules on top and on bottom of a CNT segment give the RDG-CNFET, which is reconfigurable to via, short, MOSFET-like CNFET, and open.
3. Via-forming molecules both on top and on bottom of a CNT segment give a device which is reconfigurable to be stacked via, simple via, or double gate FET.

Via-forming (electrically bistable) molecules should be present between any two adjacent layers. Gate-forming (redox active) molecules should be present next to each layer for gate isolation. Gate-forming (redox active) and via-forming (electrically bistable) molecules should be evenly distributed on each layer for performance.

Voltage Controlled Carbon Nanotube Addressing Circuits

Figure 5:
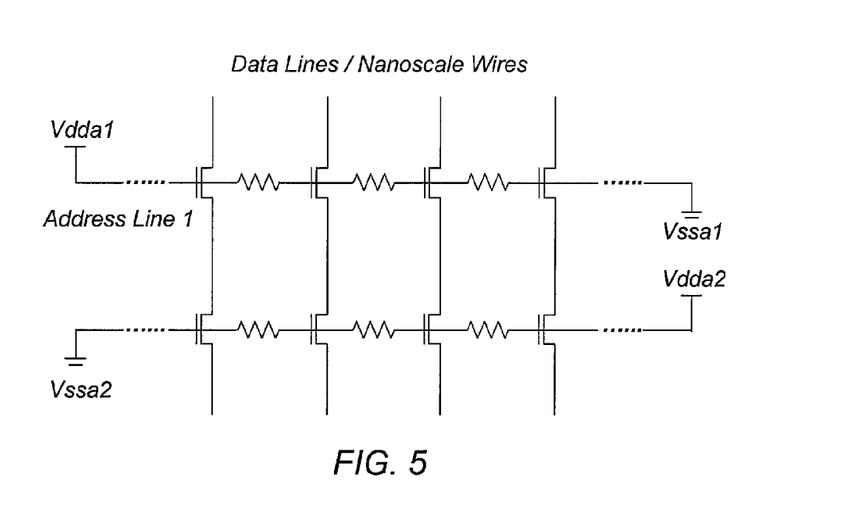
FIG. 5. depicts a schematic diagram of a voltage controlled nanoscale wire addressing circuit.

FIG. 5 is a schematic illustration of a voltage controlled nanoscale wire addressing circuit, which is constructed by running two address lines (of either microscale or nanoscale wires) on top of the data lines (of nanoscale wires in an array which are to be addressed). The address lines and the data lines are orthogonal. At each crossing of an address line and a data line, a field effect transistor is formed (e.g., by doping the data line, both nanowire based and carbon nanotube based field effect transistors can be formed, see, for example, Duan et al. "Nonvolatile Memory and Programmable Logic from Molecule-Gated Nanowires," Nano Letters, 2(5), pp. 487-490, 2002; Nguyen et al. "Direct Integration of Metal Oxide Nanowire in Vertical Field-Effect Transistor," Nano Letters, 2004, 4(4), pp. 651-657 and Raychowdhury et al. "Carbon Nanotube Electronics: Design of High Performance and Low Power Digital Circuits," IEEE Trans. on Circuits and Systems—I: Fundamental Theory and Applications, 54(11), pp. 2391-1401, 2007. all of which are incorporated herein by reference). The address line provides the gate voltage for the transistors. Each address line is connected to two external voltages at the ends ($V_{dda1}$ and $V_{ssa1}$ for address line 1, $V_{dda2}$ and $V_{ssa2}$ for address line 2). The position of a nanoscale wire in the array gives the gate voltage for the transistor on the nanoscale wire alone the address line. For example, a i-th nanoscale wire (starting from Vss) in an array of n equally spaced nanoscale wires has a transistor gate voltage $$V_g(i, n) = \frac{i}{n} V_{dd} + \frac{n-i}{n} V_{ss} \quad (1)$$

in an address line connecting to two external voltage sources Vdd and Vss. Here we assume uniform address lines of negligible external resistance (from the first or the last nanoscale wire to the nearest external voltage source).

A transistor is on if its gate voltage exceeds the threshold voltage $V_g > V_{th}$. A nanoscale wire is conductive if both transistors on it are on. Because the two address lines provide an increasing series and a decreasing series of gate voltages respectively, only nanoscale wires at specific positions in the array are conductive. For example, for $V_{dda1} = V_{dda2}$ and $V_{ssa1} = V_{ssa2}$, the nanoscale wire in the middle of the array gets conductive.

In general, to select the i-th nanoscale wire (starting from $V_{ssa2}$) in an array of n nanoscale wires, the external voltages should be (e.g., by extending the nanoscale wire array virtually to make the selected nanoscale wire in the middle):

$$V_{dda1} = 1, V_{ssa1} = \frac{2x-1}{2x} \quad (2)$$
$$V_{dda2} = \frac{1}{2x}, V_{ssa2} = 0$$

where x=i/n. Here the voltages are normalized by $V_{dda1}$.

CNT Crossbar Based Nano-Architecture

Figure 6:
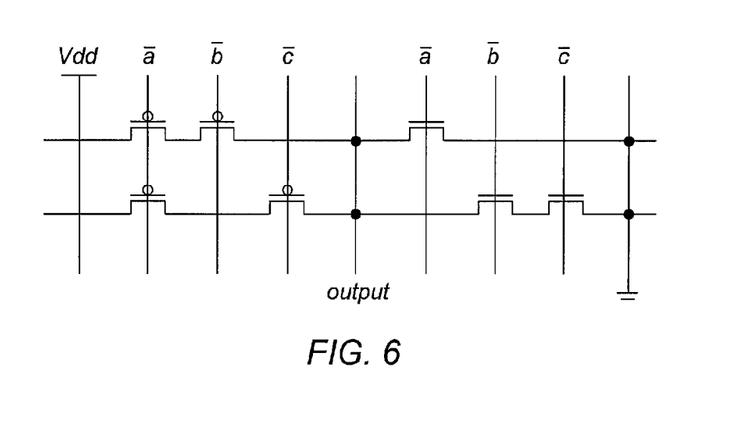
FIG. 6. depicts a schematic diagram of an RDG-CNFET based Boolean logic a(b+c) implementation.

A nanoelectronic architecture of regularity and manufacturability provides high logic density implementations of all CMOS logics, including the standard CMOS logic (e.g., in FIG. 6), domino logic, pass-transistor logic, etc., for combinational circuits, as well as latches, flip-flops, memory input address decoder and output sensing circuits.

Such high logic density is achieved via direct connection of CNFETs through their source/drain regions (e.g., as in an latest Intel microprocessor implementation), without going through additional (e.g., metal) interconnects. CNT-metal contacts are known to bring the most significant resistivity in CNT technology. Avoiding such CNT-metal contacts contributes to performance and reliability improvements. Furthermore, reduced interconnect length also leads to reduced interconnect capacitance, and improved circuit performance.

This nanoelectronic architecture also provides a high reconfigurability by allowing an arbitrary ratio of logic gates and interconnect switches (a RDG-CNFET device can be configured as either a logic gate or an interconnect switch). A pre-determined ratio of logic devices and interconnect switches (e.g., in standard cell designs and FPGA architectures where cells and routing channels are separated) constrains design optimization and may lead to inefficient device or interconnect utilization. Allowing an arbitrary ratio of logic gates and interconnect switches (e.g., as in sea-of-gate designs) provides increased degree of freedom for design optimization.

The nanoelectronic architecture is also the first to include multiple routing layers. Multiple routing layers (as in the current technologies) are necessary for VLSI designs, as Rent's rule suggests that the I/O number of a circuit module follows a power law with the gate number in the module. A small routing layer number could lead to infeasible physical design or significant interconnect detouring, resulting in degraded performance and device utilization.

The circuit performance in the RDG-CNFET based nanoelectronic architecture was compared to existing nanoelectronic architectures. Considering DNA-guide self-assembly based nanoelectronic architectures such as NANA and SOSA target the far future, and FPNI is very similar to CMOS technology by employing CMOS transistors and nanowires. RDG-CNFET based logic implementation was compared with molecular diode and MOS transistor based logic implementation which is the mainstream nanoelectronic architecture in literature.

Figure 7:
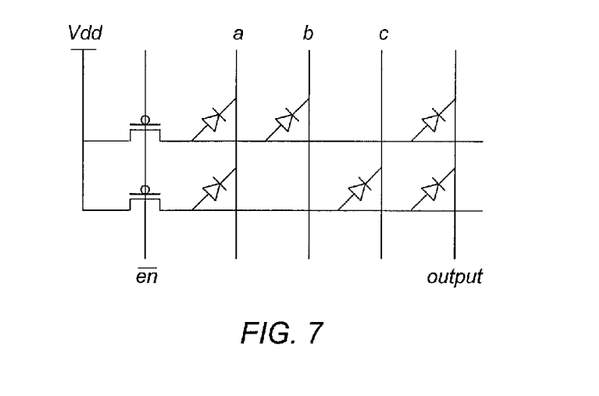
FIG. 7 depicts a schematic diagram of a molecular diode/MOSFET based Boolean logic a(b+c) implementation.

As an example of a combinational logic block, a Boolean logic function a(b+c) is implemented based on RDG-CNFETs (FIG. 6) and by molecular diodes and peripheral CMOS transistors (FIG. 7). In the following experiments, SPICE simulation is conducted based on the latest Stanford compact CNFET model, a molecular device model from a latest publication, and the latest Predictive CMOS Technology Model.

The RDG-CNFETs are constructed based on an enhancement mode CNFET of 6.4 nm gate width and 32 nm channel length, as is described in the Stanford compact model. The bistable molecules at the front gate provide a resistance difference between GΩ and about 10Ω. The redox active molecules at the back gate are cobalt phthalocyanine (CoPc), which have been the basis of a NW-FET device with 1000× conductance difference.

The molecular diodes are based on V-shaped amphiphilic [2]rotaxane $5^{4+}$ molecules, with saturation current $I_s$=36 pA, emission coefficient N=14.66, and an on/off current ratio of 194.9. The CMOS transistors are modeled by 22 nm Predictive Technology Models. To balance the current difference between molecular diodes and PMOS transistors, the PMOS transistors have a channel width/length ratio W/L=1/10, while each molecular diode consists of 10,000 V-shaped amphiphilic [2]rotaxane $5^{4+}$ molecules. As a result, the circuit has a current on the order of nA.

Comparing the CNFET based and the molecular diode/CMOS based logic implementations, the following was observed.

1. Area: The CNFET based logic implementation takes an area of 2×6=12 CNFETs and 2×3=6 vias, while molecular diodes and MOSFET based implementation takes an area of 2×4=8 molecular diodes and 2 MOSFETs (and two more MOSFETs if an inverter is included at each output to restore signal voltage swing). Considering CNFET based implementation is in a complementary logic, and the MOS transistors do not scale well, CNFET based implementation may achieve superior logic density at a nanometer technology node.

2. Signal reliability: The CNFET based logic implementation achieves full voltage swing at the outputs, while in the diode logic circuit, the output swing depends on the inputs, and varies between 0.503V to 0.735V in the experiment (Table I). Additional CMOS circuitry (e.g., an inverter) can be included at each output to restore full voltage swing, however, the reduced signal voltage swing in the diode logic circuit still implies compromised signal reliability.

3. Static power: The CNFET based logic implementation in CMOS logic achieves orders of magnitudes of less power consumption compared with molecular diodes and MOSFET based implementation for most input vectors (Table I).

TABLE I

OUTPUT VOLTAGE AND STATIC POWER CONSUMPTION WITH DIFFERENT INPUTS OF RDG-CNFET AND MOLECULAR DIODE BASED BOOLEAN LOGIC a(b + c) IMPLEMENTATIONS.

| | Mo. Diode | | RDG-CNFET | |
|---|---|---|---|---|
| abc | $V_{out}$ (V) | $P_{static}$ (W) | $V_{out}$ (V) | $P_{static}$ (W) |
| 111 | 0.999 | 1.49n | 1.000 | 0.25n |
| 110 | 0.807 | 0.83μ | 1.000 | 0.33n |
| 101 | 0.807 | 0.83μ | 1.000 | 0.32n |
| 011 | 0.497 | 1.45μ | 0.000 | 15.34p |
| 000 | 0.265 | 1.47μ | 0.000 | 41.32p |

4. Performance: The CNFET based logic implementation achieves orders of magnitude of timing performance improvement compared with molecular diodes and MOSFET based implementation (Table II).

TABLE II

RISING/FALLING SIGNAL PROPAGATION DELAYS Dr/Df (ns) (FROM a TO output) FOR VARIOUS LOAD CAPACITANCE $C_L$ (fF) OF RDG-CNFET AND MOLECULAR DIODE BASED BOOLEAN LOGIC a(b + c) IMPLEMENTATIONS. INPUT SIGNAL TRANSITION TIME VARYING FROM 1 ps TO 100 ps LEADS TO NO CONSIDERABLE DELAY DIFFERENCE.

| | Mo. Diode | | RDG-CNFET | |
|---|---|---|---|---|
| $C_L$ (fF) | $D_r$ (ns) | $D_f$ (ns) | $D_r$ (ns) | $D_f$ (ns) |
| 1 | 0.37 | 0.63 | 0.01 | 0.01 |
| 10 | 3.31 | 6.61 | 0.08 | 0.08 |
| 100 | 32.77 | 62.29 | 0.77 | 0.78 |

As a result, CNFET based logic implementation achieves superior logic density, reliability, performance, and power consumption compared with molecular diodes and CMOS-FET based Boolean logic implementation.

Nano-Addressing Circuit

This section presents SPICE simulation results based on the Stanford CNFET compact model which verifies the effectiveness of a voltage controlled nanotube addressing circuit (FIG. 5).

Figure 8:
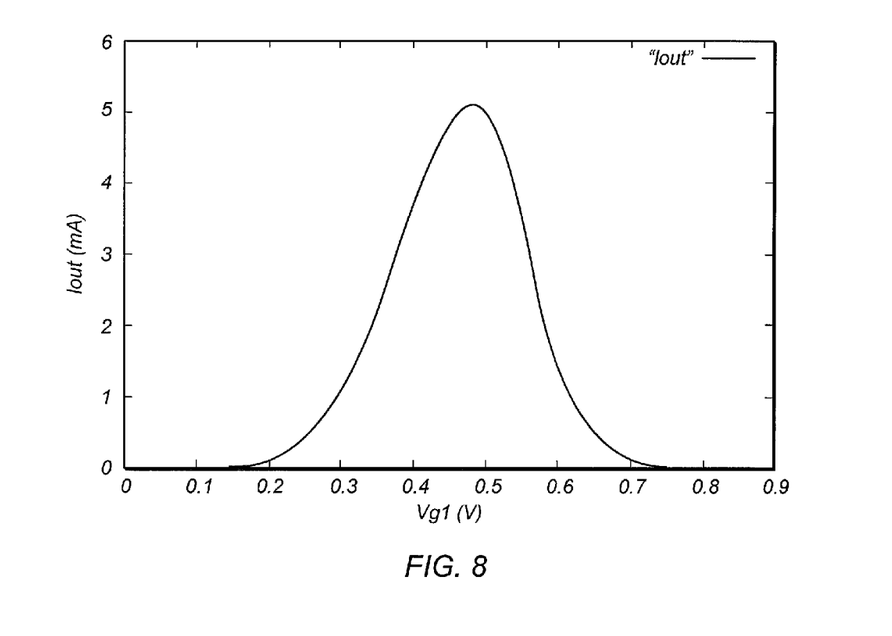
FIG. 8 depicts nanotube current $I_{out}$ in mA for CNFET gate voltage $V_{g1}$ in the first address line.

With the proposed voltage controlled nanotube addressing circuit, each nanotube is gated by two N-type MOSFET-like CNFETs. These CNFETs are of 6.4 nm gate width and 32 nm channel length, as are described in the Stanford CNFET compact model. The two CNFETs in each nanotube are given a voltage drop of $V_{dd}$=1V. The external address voltages are $V_{dda1}=V_{dda2}=1V$, $V_{ssa1}=V_{ssa2}=0$. As a result, the CNFETs have complementary gate voltages $V_{g1}+V_{g2}=1V$. FIG. 8 gives the current for each nanotube in the array (data lines) with different gate voltage at the first address line.

The nanotubes carry a significant current only with specific gate voltages, e.g., reaching $I_{out}$=5.064 mA at gate voltage Vg1=0.495V. This allows the gate voltage to be adjusted via the external address voltages, and address a specific carbon nanotube in the array.

To precisely address a single nanotube, two adjacent nanotubes carry significantly different currents. This may be achieved by the following two techniques.
1. Increase the current-to-voltage sensitivity of the CNFETs.
The current-to-voltage sensitivity is represented by the slopes in FIG. 8. MOSFETs and MOSFET like CNFETs are limited to an inverse subthreshold slope of 60 mV/decade at 300K.
2. Increase the gate voltage difference between two adjacent nanotubes.

Single nanotube addressing resolution is achievable even without development of alternative devices, for example, by applying well separated address voltages, e.g., high positive and high negative address voltages. Such high voltages bring a number of reliability issues, such as eletromigration, and gate dioxide breakdown. Carbon nanotubes are highly resistive to eletromigration due to its high resistivity and excellent current carrying capability. While gate dioxide breakdown needs to be prevented by application of new material.
3. Novel circuit design techniques also help to achieve improved nano-addressing resolution, e.g., by applying cascaded amplifiers or Winner-Takes-All circuits.

Yield

The proposed voltage controlled nano-addressing circuit leads to significant yield improvement due to the following reasons.
1. The existing nano-addressing circuits which are based on binary decoders requires every nanoscale wire have a unique physical structure to differentiate itself, which is unlikely to achieve in a nanoscale manufacturing process—lithography cannot achieve nanoscale resolution, while bottom-up self-assembly based nanoscalemanufacturing processes provide only regular structures. Even at microscale, such a structure is subject to prevalent catastrophic defects and significant parametric variations, which result in low yield.
2. On the contrary, the proposed circuit consists of only uniform components in a regular structure. Every nanoscale wire has a uniform physical structure and is differentiated by their electrical parameters, e.g., the node voltages. This scheme avoids any precise layout design and significantly improves yield and enables aggressive scaling of the addressing circuit with the rest of the nanoelectronic system.

Robustness

A voltage-controlled nano-addressing circuit is adaptive and achieves improved robustness in the presence of defects and process variations as follow.
1. Global address line resistance variations, including width, height, and resistivity variation for every segment of the address lines, have no effect on the proposed voltage controlled nano-addressing circuit.
2. Address line misalignment has no effect, given the nanotubes are highly conductive.
3. Global data line misalignment (i.e., shifting), as well as variations of external voltages and contact resistance can be canceled by tuning the external voltages, with a feedback mechanism which monitors which nanotube is addressed.
4. Local data line misalignment could decrease the difference between the gate voltages of two adjacent transistors, leading to higher resolution requirement to distinguish the two nanotubes. However, no two adjacent transistors will have two identical gate voltages, given the gate voltages are in an either increasing or decreasing array. Furthermore, nanotechnology development has significantly reduced and is expected to continue to reduce such nanotube array misalignment.
5. Process variations of the transistors, including size, dopant, and oxide thickness variations, affect the conductivity of the nanotubes. The difference in conductivity of two adjacent nanotubes needs to be larger than the process variation induced conductivity perturbations.

Addressing Capability

Addressing accuracy is the capability of accurately locating a nanoscale wire in an array. This can be measured by the offset distance of a conductive nanoscale wire to its target location. For the circuit shown, given a feedback mechanism, any offset can be corrected by adjusting the external voltages, e.g., by increasing/decreasing $V_{dda1}$ and $V_{ssa1}$, or $V_{dda2}$ and $V_{ssa2}$ simultaneously.

Addressing resolution is the capability of distinguishing two adjacent nanoscale wires in an array. This can be measured by the current ratio on two adjacent nanoscale wires.

$$r = \frac{I_i}{I_j} \quad (3)$$

where $i=j+1$ or $i=j-1$. The resolution of an addressing circuit can be characterized by the most critical (i.e., minimum) resolution under all conditions (e.g., of inputs and process variations).

$$R = \text{Min}\left\{\frac{I_{on}}{I_{off}}\right\} \quad (4)$$

where $I_{on}$ is the current of a selected nanoscale wire, $I_{off}$ is the current of an unselected nanoscale wire.

Addressing resolution is largely given by the current-to-voltage sensitivity of the pass transistors. The sub threshold current of a MOSFET (and a MOSFET like CNFET) is given by:

$$I_{sub} = I_0 \exp\left(\frac{V_{gs} - V_{th}}{mv_T}\right)\left(1 - \exp\left(\frac{-V_{ds}}{v_T}\right)\right) \quad (5)$$

where $v_T$ is the thermal voltage given by $kT/q$. The current-to-voltage sensitivity is limited by an inverse subthreshold slope S (which is the minimum gate voltage variation needed to bring a 10× source-drain current increase) of 2.3 kT/q≈60 mV/decade at 300K for MOSFETs and MOSFET like CNFETs.

In this patent, certain U.S. patents, U.S. patent applications, and other materials (e.g., articles) have been incorporated by reference. The text of such U.S. patents, U.S. patent applications, and other materials is, however, only incorporated by reference to the extent that no conflict exists between such text and the other statements and drawings set forth herein. In the event of such conflict, then any such conflicting text in such incorporated by reference U.S. patents, U.S. patent applications, and other materials is specifically not incorporated by reference in this patent.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A double gate carbon nanotube field effect transistor, comprising:
    a first carbon nanotube (CNT) positioned as the front gate of the double gate carbon nanotube field effect transistor;
    a second doped CNT orthogonal to the first CNT, wherein the second CNT is the source, the drain, and the channel of the double gate carbon nanotube field effect transistor; and
    a third CNT positioned as the back gate, wherein the third CNT has the same orientation as the first CNT;
    wherein the double gate carbon nanotube field effect transistor is reconfigurable to be open, short, FET, or via;
    wherein electrically bistable molecules are coated around the first CNT and sandwiched between the first CNT and the second CNT;
    wherein a dielectric layer is formed between the second CNT and the third CNT; and
    wherein redox active molecules are coated around the third CNT gate and sandwiched between the third CNT and the dielectric layer.

2. The transistor of claim 1, wherein the first CNT is in a metallic state, doped to n-type, or doped to p-type.

3. The transistor of claim 1, wherein the second CNT is doped to p-n-p; p-i-p; n-p-n; or n-i-n type.

4. The transistor of claim 1, wherein the third CNT is in a metallic state, doped to n-type, or doped to p-type.

5. The transistor claim 1, further comprising a fourth CNT positioned as an interconnect for the double gate carbon nanotube field effect transistor, wherein the fourth CNT is orthogonal to the first CNT.

* * * * *